(12) United States Patent
Kato

(10) Patent No.: US 8,311,071 B2
(45) Date of Patent: Nov. 13, 2012

(54) WAVELENGTH TUNABLE LASER

(75) Inventor: Takashi Kato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/767,319

(22) Filed: Apr. 26, 2010

(65) Prior Publication Data

US 2010/0272133 A1 Oct. 28, 2010

(30) Foreign Application Priority Data

Apr. 27, 2009 (JP) ................................ 2009-108219

(51) Int. Cl.
*H01S 5/00* (2006.01)
(52) U.S. Cl. .......... 372/50.11; 372/20; 372/96; 372/102
(58) Field of Classification Search ............... 372/50.11
See application file for complete search history.

(56) References Cited

U.S. PATENT DOCUMENTS

| 7,542,503 | B2 * | 6/2009 | Anselm ........................... 372/96 |
| 2004/0190580 | A1 * | 9/2004 | Pezeshki et al. ................. 372/96 |
| 2004/0218638 | A1 * | 11/2004 | Carter et al. .................... 372/20 |
| 2006/0209911 | A1 * | 9/2006 | Takabayashi .................... 372/20 |
| 2009/0168817 | A1 * | 7/2009 | Ishikawa et al. ................. 372/20 |

FOREIGN PATENT DOCUMENTS

JP 2004-336002 11/2004

OTHER PUBLICATIONS

B. S. Kim et al., "Time-Domain Large-Signal Analysis of Widely Tunable DBR Laser Diodes with Periodically Sampled and Chirped Gratings", IEEE Photonics Technology Letters, vol. 10, pp. 39-41, 1998.*

* cited by examiner

*Primary Examiner* — Patrick Stafford
*Assistant Examiner* — Xinning Niu
(74) *Attorney, Agent, or Firm* — Smith, Gambrell & Russell, LLP

(57) ABSTRACT

A wavelength tunable laser includes a DFB portion including a first optical waveguide provided with a first grating; a DBR portion including a second optical waveguide that is optically coupled to the first optical waveguide and is provided with a plurality of second gratings continuously arranged in a waveguide direction; and a phase shift portion including a third optical waveguide that is optically coupled to the first and second optical waveguides. Each of the second gratings has a grating formation area in which a grating is formed, and a grating phase shift area which shifts the phase of the grating adjacent thereto in the second grating.

15 Claims, 14 Drawing Sheets

--Prior Art--

Wavelength [$\mu$m]

--Prior Art--

WAVELENGTH TUNABLE LASER

BACKGROUND OF THE INVENTION

1. Field of the Invention

The present invention relates to a wavelength tunable laser.

2. Description of the Related Art

A wavelength tunable laser described in, for example, Japanese Unexamined Patent Application Publication No. 2004-336002 (hereinafter, referred to as document '002) has been known. The wavelength tunable laser described in document '002 includes an active layer having a gain, a distributed-feedback (DFB) area in which a sampled grating (SG) is formed, a distribution Bragg reflector (DBR) area in which a sampled grating is formed, and a phase control area. The sampling period of the sampled grating formed in the DBR area is different from the sampling period of the sampled grating formed in the DFB area.

SUMMARY OF THE INVENTION

The wavelength tunable laser described in document '002 may emit light with a wavelength other than a desirable wavelength due to the sampled grating formed in the DBR area. The problem will be described with reference to FIGS. 13 and 14.

A dotted line in FIG. 13 indicates reflectivities in the DBR area in which the sampled grating is formed. A solid line in FIG. 13 indicates reflectivities in the DFB area in which the sampled grating is formed. Both the reflectivities in the DBR area with the sampled grating, and the reflectivities in the DFB area with the sampled grating have a plurality of reflectivity peaks. However, as indicated by the dotted line in FIG. 13, the reflectivities in the DBR area in which the sampled grating is formed involve a wavelength exhibiting the highest reflectivity (maximum peak wavelength: wavelength A in FIG. 13), and the reflectivities with reflectivity peak wavelengths (wavelengths B, C, and D in FIG. 13) are reduced as the wavelengths are away from the maximum peak wavelength.

Herein, the difference between a threshold gain (hereinafter, referred to as Gth0) at each peak wavelength and a corresponding threshold gain (hereinafter, referred to as Gth1) at a wavelength of a longitudinal mode that is closest to the each peak wavelength is called threshold gain difference (Gth1−Gth0). FIG. 14 illustrates threshold gain differences with respective peak wavelengths. To estimate the threshold gain differences with respective peak wavelengths in FIG. 14, the reflection spectrum of the grating in the DFB area is fixed. Furthermore, the reflectivity peaks of the DBR area are matched with the reflectivity peaks in the DFB area (i.e., the peak wavelengths A, B, C, and D are respectively matched with the peak wavelengths E, F, G and H in FIG. 13) by injecting current in the DBR area.

It is to be noted that FIG. 14 plots only the case in which the peak wavelengths in the DBR area (the peak wavelength E, F, G, and H in FIG. 13) are respectively matched with the peak wavelengths in the DFB area (the peak wavelengths A, B, C, and D in FIG. 13), in a wavelength range of the center wavelength and larger. The similar tendency appears even when the threshold gain differences in a wavelength range of the center wavelength and smaller are plotted.

If the threshold gain difference is negative, Gth1<Gth0 is established, and the laser may emit light with a wavelength of the closest longitudinal mode to the each peak wavelength. The laser does not emit light with wavelengths with which the peak wavelengths in the DBR area are matched with the peak wavelengths in the DFB area.

The inventors of the present invention have considered the possibility of the grating in the DBR area that is formed of a phase grating (PG) with a reflectivity which is less wavelength-dependent. In the course of the consideration, the inventors have found that the phase of reflected light largely varies when the grating in the DBR area is formed of the PG, and hence light with a desirable wavelength cannot be emitted. Document '002 does not describe this point or clarify the reason thereof. The present invention is made on the basis of the new finding.

A wavelength tunable laser according to an aspect of the present invention includes a DFB portion including a first optical waveguide provided with a first grating; a DBR portion including a second optical waveguide that is optically coupled to the first optical waveguide and is provided with a plurality of second gratings continuously arranged in a waveguide direction; and a phase shift portion including a third optical waveguide that is optically coupled to the first and second optical waveguides. Each of the second gratings has a grating formation area in which a grating is formed, and a grating phase shift area which shifts the phase of the grating adjacent thereto in the second grating. The second grating has a first length in the waveguide direction.

With this configuration, since the second grating in the DBR portion is formed of a PG, the DBR portion can have the reflectivity that is less wavelength-dependent, and hence the threshold gain condition can be constant in a wide wavelength band as compared with the case in which the second grating in the DBR portion is formed of a SG. Accordingly, threshold current and optical output with each wavelength can be stable.

Also, since the second grating in the DBR portion is formed of the PG the peak wavelengths in the reflection spectrum are limited within a predetermined wavelength band as compared with the case in which the second grating in the DBR portion is formed of a SG. Thus, the wavelength of the light that is emitted by the wavelength tunable laser can be controlled in a desirable wavelength the predetermined wavelength band.

Furthermore, the phase shift portion is provided. Accordingly, the phase of reflected light can be adjusted and laser light of stable optical output with a desirable wavelength can be obtained.

Preferably, the wavelength tunable laser may further include a phase control electrode provided on the phase shift portion. The phase control electrode applies phase control current to the phase shift portion. When the phase control current is applied to the phase shift portion, the phase of the light that is guided through the optical waveguides can be adjusted. Accordingly, the problem, in which light is emitted with a wavelength other than a desirable wavelength because the phase of the light reflected by the DBR portion is largely shifted, can be properly prevented.

In this wavelength tunable laser, each of the grating phase shift areas in a plurality of second gratings substantially has the same length. And the second grating may include a periodic recesses and projections to form the grating.

In this wavelength tunable laser, the first grating may be formed of a sampled grating (SG). With this configuration, since the second grating in the DBR portion is formed of the PG, the DBR portion can have the reflectivity that is less wavelength-dependent as compared with the case in which the second grating in the DBR portion is formed of the SG. In addition, the peak wavelengths in the reflection spectrum are limited within a predetermined wavelength band. Accordingly, laser light of stable optical output with a desirable wavelength can be obtained. Also, since the first grating is formed of the SG, the shift of the phase (phase shift amount) at each reflection peak is small. Thus, the phase control can be further facilitated.

In this wavelength tunable laser, the first grating may have a larger coupling coefficient than a coupling coefficient of the second grating. Accordingly, the reflectivity of the DBR portion can be further increased.

In this wavelength tunable laser, the first optical waveguide may have a plurality of the first gratings continuously arranged in the waveguide direction. Each of the first gratings may have a grating formation area in which a grating is formed, and a grating phase shift area which shifts the phase of the grating adjacent thereto in the first grating.

Since the first grating in the DFB portion is formed of the PG, the coupling coefficient of the grating can be decreased as compared with the case in which the first grating in the DFB portion is formed of the SG. Thus, the formation of the grating can be facilitated.

Preferably, the wavelength tunable laser may further include a temperature control unit to adjust a temperature of the first optical waveguide. The temperature control unit may be a Peltier device. The temperature control unit may be made of a metal thin-film formed on the upper surface of the DFB portion. In this wavelength tunable laser, a wavelength of light that is emitted by the wavelength tunable laser may be tuned by adjusting a temperature of the first optical waveguide. Accordingly, the wavelength of the light that is emitted by the wavelength tunable laser can be further easily tuned.

Preferably, the wavelength tunable laser may further include a DFB portion wavelength control electrode provided on the DFB portion. When the reflection spectrum in the first optical waveguide is adjusted by applying the DFB portion wavelength control current to the first optical waveguide through the DFB portion wavelength control electrode, the wavelength of the light that is emitted by the wavelength tunable laser can be tuned.

Preferably, the wavelength tunable laser may further include a plurality of third gratings arranged between the second gratings in the second optical waveguide. The third grating may have a grating formation area in which a grating is formed, and a grating phase shift area which shifts the phase of the grating adjacent thereto in the third grating. The third grating may have a second length in the waveguide direction, the second length being different from the first length. Accordingly, since the gratings provided in the second optical waveguide have the different lengths by adjusting the plurality of lengths, the number of peak wavelengths in the reflection spectrum can be adjusted.

Preferably, in this wavelength tunable laser, the grating formed in grating formation area of the second grating and the grating formed in grating formation area of the third grating may substantially have the same period. Furthermore, the grating phase shift area of the second grating and the grating phase shift area of the third grating may substantially have the same length.

Preferably, the second optical waveguide may have a larger length in the waveguide direction than a length of the first optical waveguide in the waveguide direction. Accordingly, a large number of grating phase shift areas can be arranged although the interval of the grating phase shift areas is increased. The reflectivity of the DBR portion can be increased.

The aforementioned object and the other object, feature, and advantages will be clearly apparent from the detailed description given below according to preferred embodiments of the present invention with reference to the attached drawings.

DESCRIPTION OF THE PREFERRED EMBODIMENTS

First Embodiment

Figure 1:
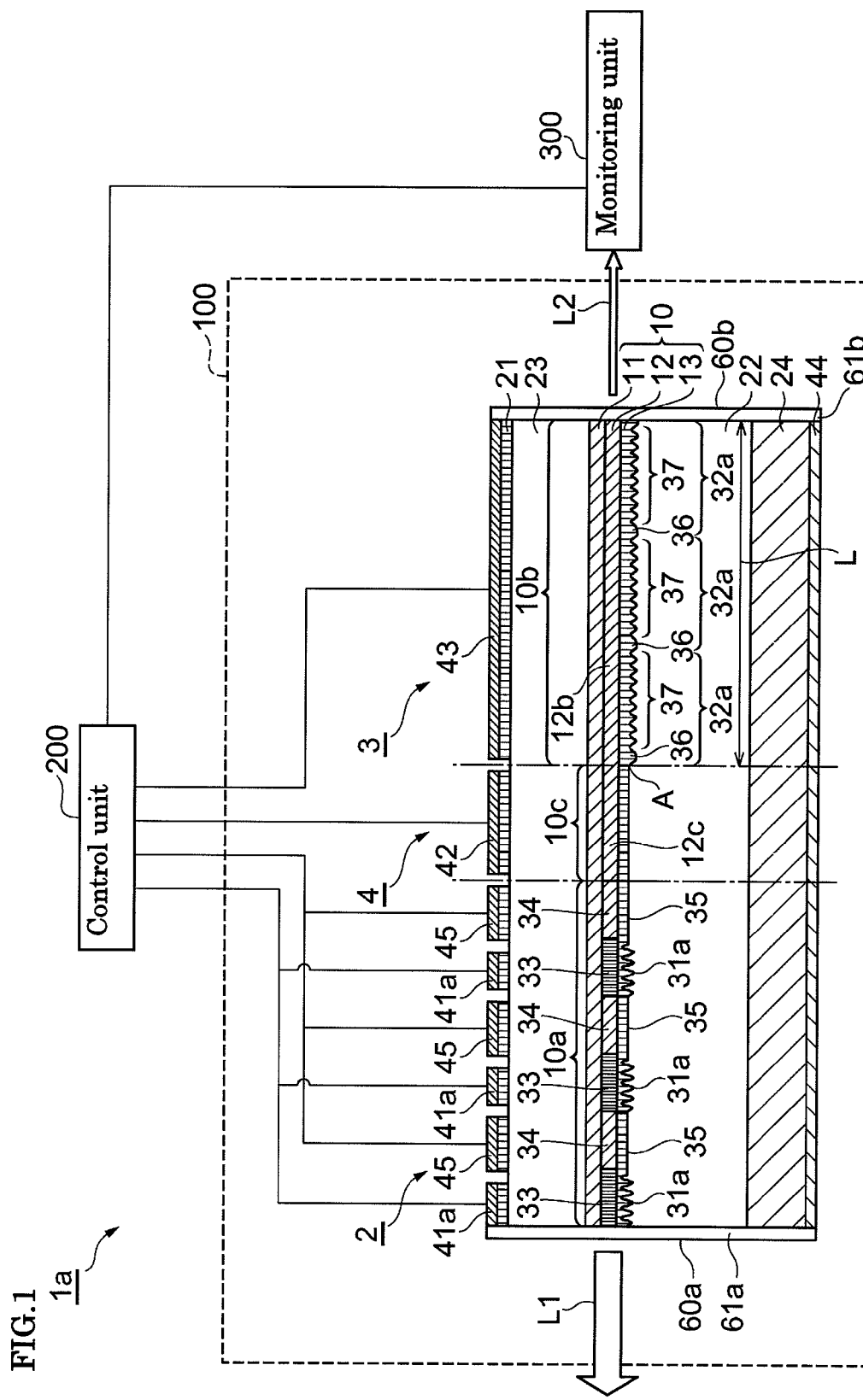
FIG. 1 illustrates a wavelength tunable laser apparatus according to a first embodiment.

An embodiment of the present invention will be described below with reference to the attached drawings. When the drawings are described, the same reference numerals refer the same or equivalent elements, and the redundant description will be omitted.

FIG. 1 illustrates a configuration of a wavelength tunable laser apparatus 1a according to this embodiment. Referring to FIG. 1, the wavelength tunable laser apparatus 1a includes a wavelength tunable laser 100, a control unit 200 that controls current to be applied to electrodes or the like arranged at proper positions in the wavelength tunable laser 100, and a monitoring unit 300 that monitors the output of the wavelength tunable laser 100 and outputs the monitored result to the control unit 200. The wavelength tunable laser 100 of this embodiment may have a lasing wavelength tunable range of from 1.25 to 1.75 micrometers. Thus, the wavelength tunable laser 100 of this embodiment can be used as a light source for a wavelength division multiplexing (WDM) optical communication system.

The wavelength tunable laser 100 includes a distributed-feedback (DFB) portion 2, a distribution Bragg reflector (DBR) portion 3, and a phase shift portion 4 located between the DFB portion 2 and the DBR portion 3. In the wavelength tunable laser 100, peak wavelengths in the reflection spectrum of the DFB portion 2 are slightly different from peak wavelengths in the reflection spectrum of the DBR portion 3. As a result, in the wavelength tunable laser 100, a desirable lasing wavelength can be selected by using the vernier effect.

The DFB portion 2 includes a first optical waveguide 10a provided with a first grating 31a. In this embodiment, unit structures each having the first grating 31a and a blank portion 35, which continues with the first grating 31a and has no grating, are periodically arranged and hence define a sampled grating (SG). The length of the first grating 31a is, for example, 50 μm and the length of the blank portion 35 is, for example, 10 μm. In this embodiment, the DFB portion 2 has eight unit structures having the first grating 31a and a blank portion 35.

An optical waveguide 10 includes an optical confinement layer 11, an optical confinement layer 13, and a core layer 12 interposed between the optical confinement layers 11 and 13.

FIG. 1 illustrates that the first grating 31a and a second grating 32a are provided in the optical confinement layer 13 (or provided below the core layer 12 in FIG. 1). However, the first grating 31a and the second grating 32a may be provided in the optical confinement layer 11 (or provided above the core layer 12 in FIG. 1). The material of the optical confinement layer 11 and the optical confinement layer 13 may be a GaInAsP or an AlGaInAs, which has higher band gap energy than that of the core layer 12 (active layer).

The DBR portion 3 includes a second optical waveguide 10b provided with the second grating 32a formed of a phase grating (PG). Since the second grating 32a is formed of the PG, the DBR portion 3 can have the reflectivity that is less wavelength-dependent, and hence the threshold gain condition can be constant in a wide wavelength band as compared with the case in which the second optical waveguide 10b includes a grating formed of a SG. Accordingly, threshold current and optical output with each wavelength can be stable.

Also, since the second grating 32a in the DBR portion 3 is formed of the PG, the peak wavelengths in the reflection spectrum are limited within a predetermined wavelength band. Thus, the light having a desirable wavelength within the predetermined wavelength band can be emitted from the wavelength tunable laser 100.

The wavelength tunable laser 100 includes the phase shift portion 4 formed between the DFB portion 2 and the DBR portion 3. The phase shift portion 4 has no grating. The phase of the light that is guided through the optical waveguide 10 can be shifted in the phase shift portion 4 by, for example, injecting current therein. In addition to the phase shift portion 4, a λ/4 phase shift part may be formed in each of the DFB portion 2 and the DBR portion 3. By forming the λ/4 phase shift parts previously, the amount of a current injecting in to the phase shift portion 4 to adjust the phase of the light can be reduced.

In this embodiment, since the phase shift portion 4 is provided, the phase of the reflected light can be controlled. The phase of the light is changed by reflection at the interface such as an end facet. Then a wavelength of the light emitted from the wavelength tunable laser 100 is changed to the undesirable wavelength. When the phase of the reflected light largely changes, the phase of the light can be controlled by injecting the current into the phase shift portion 4. As a result, a wavelength of the light can be adjusted to a desirable wavelength.

The first optical waveguide 10a, the second optical waveguide 10b, and a third optical waveguide 10c are optically coupled (the first optical waveguide 10a, the second optical waveguide 10b, and the third optical waveguide 10c are collectively referred to as the optical waveguide 10). The coupling coefficients of the gratings in the DFB portion 2 and the DBR portion 3 range from 50 to 500 $cm^{-1}$. The coupling coefficient of the first grating 31a in the DFB portion 2 is preferably larger than the coupling coefficient of the second grating 32a in the DBR portion 3.

The length of the second optical waveguide 10b in an optical waveguide direction is preferably larger than the length of the first optical waveguide 10a in the optical waveguide direction. Accordingly, the reflectivities in the DBR portion 3 can be increased.

The DFB portion 2 has an end facet 60a from which laser light L1 is emitted. The DBR portion 3 has an end facet 60b from which monitoring light L2 is emitted. Low reflection films (61a and 61b) are respectively formed on the end facets 60a and 60b. Each low reflection film may be a dielectric multilayer film.

The core layer 12 includes an active layer 33 and an optical waveguide layer 34 (first core layer), which are located in the DFB portion 2; a second core layer 12b (second core layer), which is located in the DBR portion 3; and a third core layer 12c, which is located in the phase shift portion 4. The materials of the third core layer 12c and the second core layer 12b may be a group III-V semiconductor of a GaInAsP or an AlGaInAs.

Figure 2:
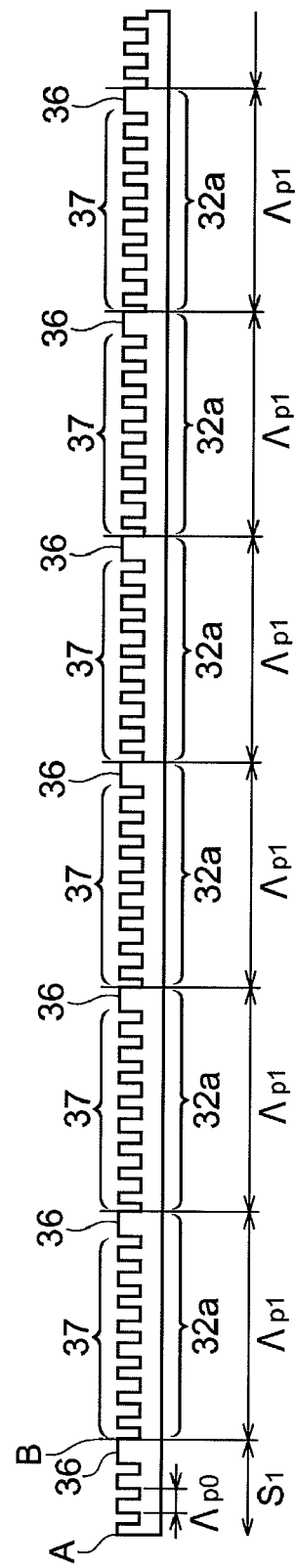
FIG. 2 is an explanatory view of a PG.

Now, the second grating 32a according to this embodiment will be described with reference to FIGS. 2 and 3. The second grating 32a is formed of the phase grating. The "phase grating" includes a grating formation area 37 and a grating phase shift area 36. The second grating 32a has a predetermined length (first length). A plurality of second gratings 32a with the first length are periodically provided in the waveguide direction. The grating formation area 37 includes a grating in which periodic recesses and projections are provided with a predetermined period. The refractive index of the optical waveguide 10 periodically varies with the predetermined period. The grating phase shift area 36 has a different length from the period of the grating of the grating formation area 37. Therefore, the grating phase shift area 36 shifts the phase of the grating adjacent to the grating phase shift area 36. Accordingly, the grating phase shift area 36 shifts the phase of the light that is guided through the optical waveguide 10, in accordance with the length thereof. Referring to FIG. 2, the grating phase shift area 36 is adjacent to the grating formation area 37 in the waveguide direction. If the length of the grating phase shift area 36 corresponds to the period of the grating, the phase shift amount of the grating is 2π. However, the length of the grating phase shift area 36 is different from the period of the grating in order to adjust the phase of the light effectively in accordance with the phase shift amount of the grating. If the length of the grating phase shift area 36 corresponds to the half of the period of the grating, the phase shift amount is π.

FIG. 2 schematically illustrates the second grating 32a which is provided in the second optical waveguide 10b. The grating of the grating formation area 37 has a "predetermined period" of $Λ_{p0}$, and the second grating 32a has a "predetermined length" of $Λ_{p1}$. Referring to FIG. 2, the distance from an end A to a start position B at which the repetition of the second gratings 32a starts is a start distance $S_1$. In a case in which a first grating 31b is formed of a phase grating (which will be described later with reference to FIG. 12), the same configuration can be applied.

Referring to FIG. 2, the end A represents the position at which the optical confinement layer 13 in the second optical waveguide 10b is adjacent to the optical confinement layer 13 in the third optical waveguide 10c of the phase shift portion 4 as shown in FIG. 1. The second gratings 32a each including the grating formation area 37 and the grating phase shift area 36 are periodically arranged from the start position B, which is at the start distance $S_1$ from the end A.

In this embodiment, it is assumed that the phase shift amount is π. However, the phase shift amount does not have to be π, and may be π/2, or any other value may be used. If the phase shift amount is π, the absolute value (|π|) of the phase shift amount is preferably the same for the entire wavelength tunable laser 100. Also, a similar advantage can be attained even if the phase shift amount is incremented or decremented by one period (that is, $2\pi$).

The second gratings 32a each having the length $\Lambda_{p1}$ are continuously arranged in the waveguide direction of the optical waveguide 10, from the start position B toward the side opposite to the end A. The second gratings 32a each include the grating formation area 37 and the grating phase shift area 36. The grating formation area 37 has the periodic recesses and projections provided with a predetermined period $\Lambda_{p0}$. In the grating phase shift area 36, the phase of the grating is shifted, and hence, the phase of the light that is guided through the optical waveguide 10 is shifted in accordance with the phase shift amount of this grating. The grating phase shift area 36 has the predetermined phase shift amount $\pi$. In this embodiment, since the grating formation area 37 has the periodic recesses and projections provided with the predetermined period $\Lambda_{p0}$, the refractive index of the optical waveguide periodically varies at the predetermined period $\Lambda_{p0}$, thereby providing the function of grating. The grating in the grating formation area 37 may have a structure such that the refractive index of the optical waveguide periodically varies with the predetermined period $\Lambda_{p0}$, for example, by causing impurity distribution to periodically vary in the optical waveguide direction.

With this configuration, the grating phase shift areas 36 are provided at a constant interval (in this example, the predetermined length $\Lambda_{p1}$) from the start position B.

The second optical waveguide 10b may further include a third grating 32b in addition to the second grating 32a, the third grating 32b having a length different from the length of the second grating 32a. FIG. 3 schematically illustrates the second grating 32a and the third grating 32b which are provided in the second optical waveguide 10b. Referring to FIG. 3, the grating of the grating formation area 37 in the second grating 32a and the third grating 32b has a "predetermined period" $\Lambda_{p0}$. Also, the second grating 32a and the third grating 32b respectively have different "predetermined lengths" $\Lambda_{p1}$ (first length) and $\Lambda_{p2}$ (second length). The length of the second grating 32a is $\Lambda_{p1}$ (first length), and the length of the third grating 32b is $\Lambda_{p2}$ (second length). Referring to FIG. 3, the second grating 32a is provided from a start position B, which is at a start distance $S_1$ from an end A. The area between the end A and the start position B is similar to the area shown in FIG. 2.

The second gratings 32a each having the length $\Lambda_{p1}$ and the third gratings 32b each having the length $\Lambda_{p2}$ are continuously alternately arranged in the waveguide direction of the optical waveguide 10, from the start position B toward the side opposite to the end A. That is, the third grating 32b is arranged between the second gratings 32a.

With this configuration, the grating phase shift areas 36 are provided at alternately repeated two intervals (in this example, the predetermined lengths $\Lambda_{p1}$ and $\Lambda_{p2}$) from the start position B. With reference to the end A, the intervals of the grating phase shift areas 36 are $S_1$, $\Lambda_{p1}$, $\Lambda_{p2}$, $\Lambda_{p1}$, $\Lambda_{p2}$, . . . .

Figure 3:
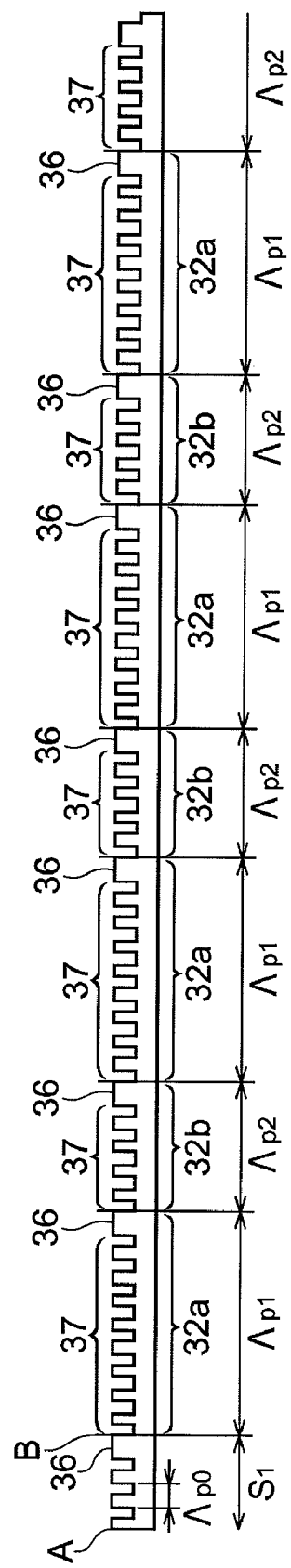
FIG. 3 is an explanatory view of the PG.

In the example shown in FIG. 3, the "predetermined lengths" are the two different lengths ($\Lambda_{p1}$ and $\Lambda_{p2}$). However, the "predetermined lengths" may be three different lengths $\Lambda_{p1}$ (first length), $\Lambda_{p2}$ (second length), and $\Lambda_{p3}$ (third length); four different lengths $\Lambda_{p1}$ (first length), $\Lambda_{p2}$ (second length), $\Lambda_{p3}$ (third length), and $\Lambda_{p4}$ (fourth length); or any other number of different lengths. In the case in which the predetermined lengths are the three different lengths, when the arrangement of the gratings is expressed in terms of the lengths, the arrangement may be $\Lambda_{p1}$, $\Lambda_{p2}$, $\Lambda_{p3}$, $\Lambda_{p1}$, $\Lambda_{p2}$, $\Lambda_{p3}$, . . . . Accordingly, the intervals of the grating phase shift areas 36 may be $S_1$, $\Lambda_{p1}$, $\Lambda_{p2}$, $\Lambda_{p3}$, $\Lambda_{p1}$, $\Lambda_{p2}$, $\Lambda_{p3}$, . . . . In the case in which the predetermined lengths are the four different lengths, when the arrangement of the gratings is expressed in terms of the lengths, the arrangement may be $\Lambda_{p1}$, $\Lambda_{p2}$, $\Lambda_{p3}$, $\Lambda_{p4}$, $\Lambda_{p1}$, $\Lambda_{p2}$, $\Lambda_{p3}$, $\Lambda_{p4}$, . . . . Accordingly, the intervals of the grating phase shift areas 36 may be $S_1$, $\Lambda_{p1}$, $\Lambda_{p2}$, $\Lambda_{p3}$, $\Lambda_{p4}$, $\Lambda_{p1}$, $\Lambda_{p2}$, $\Lambda_{p3}$, $\Lambda_{p4}$, . . . .

The grating phase shift areas 36 may be included at least in any of the above-described positions.

Figure 4:
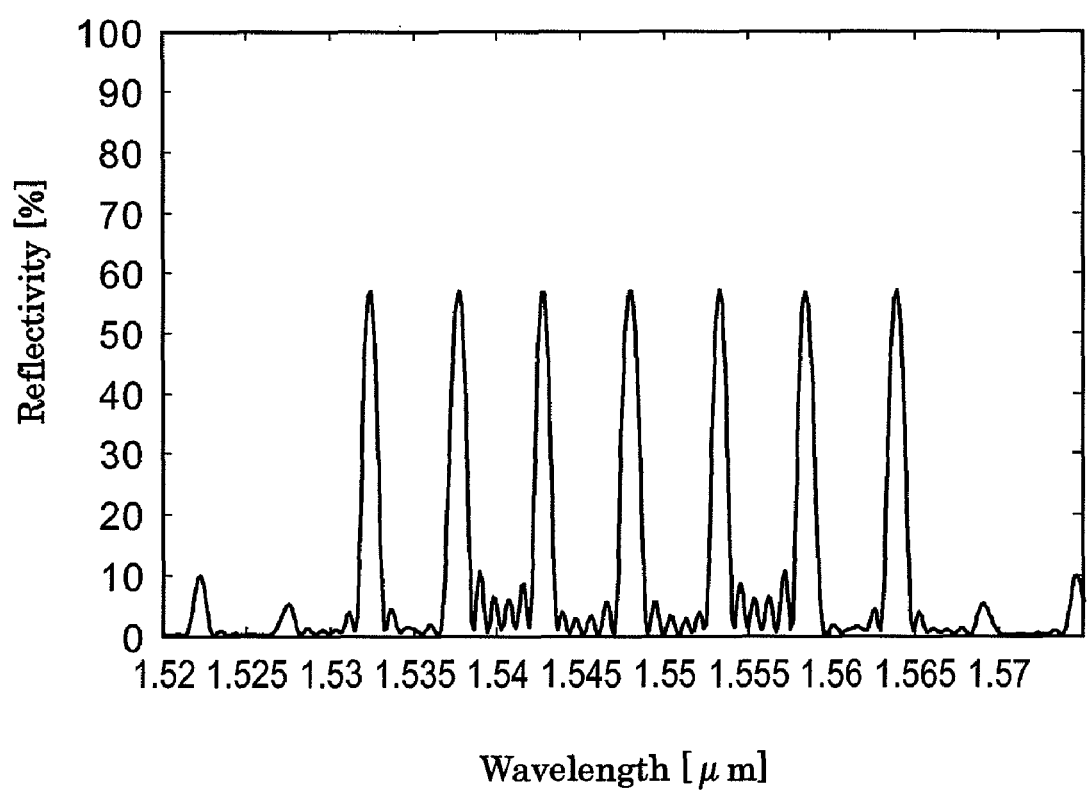
FIG. 4 illustrates an example of a reflection spectrum in an optical waveguide including a phase grating.

FIG. 4 illustrates an example of a reflection spectrum in an optical waveguide including phase gratings. The illustrated reflection spectrum is obtained when the predetermined period $\Lambda_{p0}$ is 0.2419 µm, the overall length L of the gratings is 500 µm, the coupling coefficient $\kappa$ of the gratings is 60 $cm^{-1}$, and the start distance $S_1$ is 12.396 µm. The predetermined length of the grating is a value obtained by $((\Lambda_{p0}/2)\cdot m)$ where m is an integer. The reflection spectrum shown in FIG. 4 has four predetermined intervals, in which $\Lambda_{p1}$ is 33.86 µm (m=280), $\Lambda_{p2}$ is 7.135 µm (m=59), $\Lambda_{p3}$ is 15.117 µm (m=125), and $\Lambda_{p4}$ is 15.48 µm (m=128).

The optical waveguide including phase gratings having the reflection spectrum shown in FIG. 4 has the start distance $S_1$=12.396 and the predetermined intervals which are repeated in that order of $\Lambda_{p1}$, $\Lambda_{p2}$, $\Lambda_{p3}$, $\Lambda_{p4}$, $\Lambda_{p1}$, $\Lambda_{p2}$, $\Lambda_{p3}$, $\Lambda_{p4}$, . . . . The grating phase shift areas 36 (herein, the length is $\Lambda_{p0}/2$) for the $\pi$ phase shift are provided among $\Lambda_{p1}$, $\Lambda_{p2}$, $\Lambda_{p3}$, $\Lambda_{p4}$, and $S_1$. In the reflection spectrum shown in FIG. 4, seven reflection peaks are observed in a predetermined wavelength band. No other high reflection peaks are found outside this wavelength band. Also, it is found that the reflectivities with these peak wavelengths of the reflection peaks are substantially the same. Meanwhile, variation in the repeated predetermined intervals $\Lambda_{p1}$, $\Lambda_{p2}$, $\Lambda_{p3}$, and $\Lambda_{p4}$ is the predetermined period $\Lambda_{p0}$ or smaller so that the peak wavelengths of the reflection peaks and the reflectivities can be predetermined values.

Referring back to FIG. 1, the optical waveguide layer 34 in this embodiment is a part for defining the optical waveguide that controls an emission wavelength of the wavelength tunable laser. The active layer 33 is a part for controlling an optical gain. In this embodiment, the active layer 33 is located in the core layer 12 at a position corresponding to the first grating 31a.

The optical waveguide layer 34 has higher band gap energy than that of the active layer 33. Thus, light absorption by the optical waveguide 10 can be reduced for the wavelength of light that is emitted from the active layer 33. Accordingly, the threshold current of the wavelength tunable laser can be decreased, and the optical output can be increased.

A DFB portion wavelength control electrode 45 is provided on a contact layer 21 in the DFB portion 2, at a position at which current (hereinafter, referred to as "DFB portion wavelength control current") is applied to the optical waveguide layer 34. Also, a gain control electrode 41a is provided on the contact layer 21 in the DFB portion 2, at a position at which current (hereinafter, referred to as "gain control current") is applied to the active layer 33.

The wavelength of the light emitted from the wavelength tunable laser 100 in this embodiment can be changed by using the vernier effect. Herein, the feature of lasing wavelength control with the wavelength tunable laser using the vernier effect is that the peak wavelength interval in the reflection spectrum of the first optical waveguide 10a is slightly different from the peak wavelength interval in the reflection spectrum of the second optical waveguide 10b. By slightly changing the peak wavelength of the reflection spectrum of the optical waveguide, the lasing wavelength of the wavelength tunable laser can be largely tuned.

A phase control electrode 42 is provided at an upper position of the phase shift portion 4. The phase control electrode 42 applies current (hereinafter, referred to as "phase control current") to the phase shift portion 4. The phase control current is for controlling the phase of the light that is guided through the optical waveguide 10.

A DBR portion wavelength control electrode 43 is provided at an upper position of the DBR portion 3. The DBR portion wavelength control electrode 43 applies current (hereinafter, referred to as "DBR portion wavelength control current") to the DBR portion 3. The DBR portion wavelength control current is for controlling the reflection spectrum by varying the effective refractive index of the second optical waveguide 10b.

A second cladding layer 23 is provided on the optical waveguide 10. The contact layer 21 is provided on the second cladding layer 23. The gain control electrode 41a, the phase control electrode 42, the DBR portion wavelength control electrode 43, and the DFB portion wavelength control electrode 45 are provided on the contact layer 21.

A first cladding layer 22 is provided on a semiconductor substrate 24. An n type electrode 44 is provided on the back surface of the semiconductor substrate 24. If an n type semiconductor substrate is used, the first cladding layer 22 is made of n type InP, the second cladding layer 23 is made of p type InP, and the contact layer 21 is made of highly doped p type GaInAs.

The control unit 200 has a function of controlling the intensity and wavelength of the light emitted from the wavelength tunable laser 100, by applying a current through the gain control electrode 41a, the phase control electrode 42, the DBR portion wavelength control electrode 43, and the DFB portion wavelength control electrode 45.

The monitoring unit 300 monitors the wavelength and optical output power of the light emitted from the wavelength tunable laser 100, and outputs the monitored signal to the control unit 200.

The monitoring unit 300 may monitor the monitoring light L2 that is emitted from the light emission end surface 60b. Alternatively, the monitoring unit 300 may monitor light split from the laser light L1 that is emitted from the light emission end surface 60a.

Figure 5:
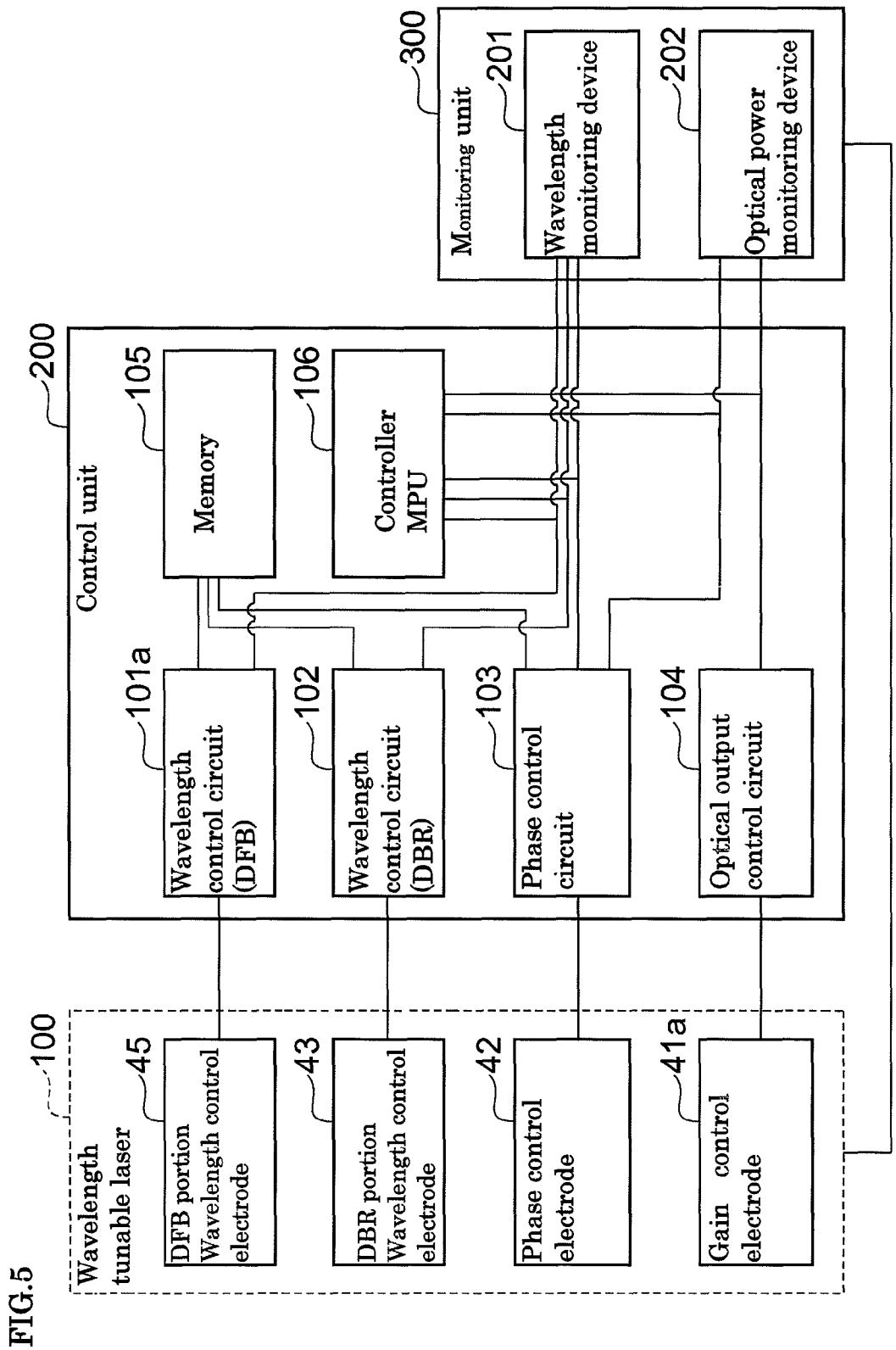
FIG. 5 illustrates a function configuration of a control unit and a monitoring unit shown in FIG. 1.

FIG. 5 illustrates a function configuration of the control unit 200 and the monitoring unit 300. Referring to FIG. 5, the control unit 200 includes a wavelength control circuit (DFB) 101a, a wavelength control circuit (DBR) 102, a phase control circuit 103, an optical output control circuit 104, a memory 105, and a controller microprocessing unit (MPU) 106.

The wavelength control circuit (DFB) 101a in the control unit 200 adjusts the current that is applied to the optical waveguide layer 34 through the DFB portion wavelength control electrode 45. Thus, the wavelength control circuit (DFB) 101a has a function of controlling one of a plurality of peak wavelengths in the reflection spectrum of the first optical waveguide 10a provided with the first grating 31a, to a desirable lasing wavelength λ0.

The wavelength control circuit (DBR) 102 adjusts the DBR portion wavelength control current that is applied through the DBR portion wavelength control electrode 43.

Thus, the wavelength control circuit (DBR) 102 has a function of controlling one of a plurality of peak wavelengths in the reflection spectrum of the second optical waveguide 10b provided with the second grating 32a, to λ0.

The phase control circuit 103 has a function of controlling the phase control current such that the lasing wavelength is finely tuned and the optical output power of the light emitted from the wavelength tunable laser 100 becomes maximum.

In this embodiment, the wavelength tunable laser apparatus 1a includes the phase control circuit 103, to control the phase of the light. Accordingly, a lasing wavelength can be tuned to a desirable wavelength even if the phase of the light reflected from the DBR portion varies.

The optical output control circuit 104 adjusts the gain control current that is applied through the gain control electrode 41a. Thus, the optical output control circuit 104 has a function of controlling the optical output power of the light that is emitted by the wavelength tunable laser 100 to a desirable value.

The memory 105 has a function of storing, as initial values, the relationship between the DBR portion wavelength control current and the peak wavelength in the reflection spectrum of the first optical waveguide 10a, the relationship between the DBR portion wavelength control current and the peak wavelength in the reflection spectrum of the second optical waveguide 10b, the relationship between the setting value controlled by the control unit 200 and the monitored result of the monitoring unit 300, and the calculated results of these relationships. The stored values are used as the initial values when the same value λ0 is selected next time.

The monitoring unit 300 includes a wavelength monitoring device 201, and an optical output monitoring device 202. The wavelength monitoring device 201 monitors the wavelength of the light that is emitted by the wavelength tunable laser 100. The optical output monitoring device 202 monitors the optical output power of the light that is emitted by the wavelength tunable laser 100.

For example, the wavelength monitoring device 201 specifically corresponds to a wavelength locker. Also, for example, the optical output monitoring device 202 specifically corresponds to a monitor photodiode.

Next, a method of manufacturing the wavelength tunable laser 100 according to this embodiment will be described.

FIG. 1 illustrates an example of the layer structure of the wavelength tunable laser 100. The layer structure can be formed by growing respective layers on a semiconductor substrate of, for example, GaAs or InP, by an epitaxial growth method, such as metal-organic vapor phase epitaxy (MOVPE) method. The gratings can be formed by forming a pattern with periodic recesses and projections by an electron beam exposure technique. If the DFB portion 2 has a layer structure different from that of the DBR portion 3, any of the layers may be removed by etching, and then another layer structure may be formed thereon by re-growing.

Flow of Process

Figure 6:
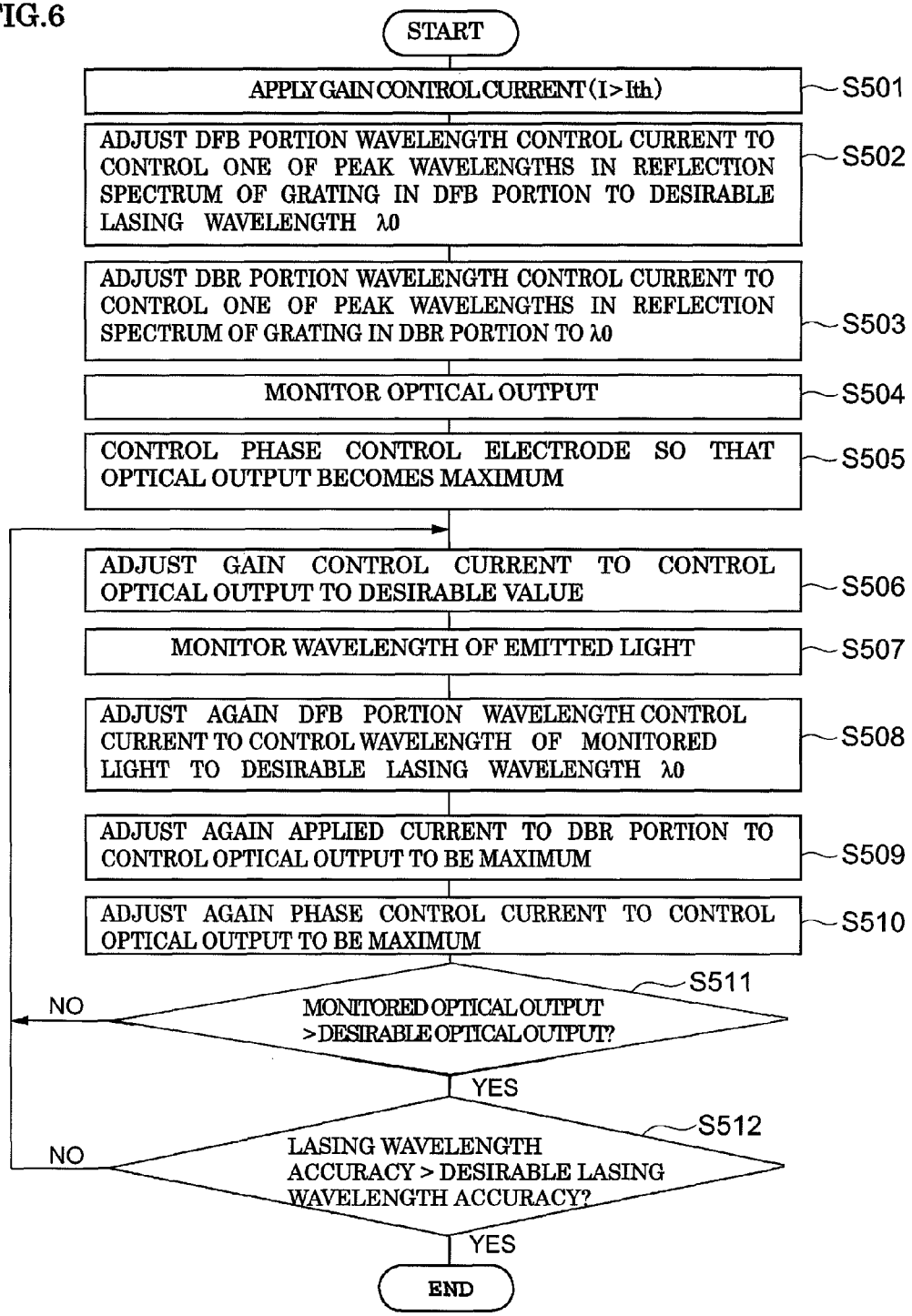
FIG. 6 is a process flowchart showing a wavelength tunable laser control method according to the first embodiment.

The flow of process according to this embodiment will be described with reference to FIG. 6.

The optical output control circuit 104 applies the gain control current to the active layer 33 in the DFB portion 2, through the gain control electrode 41a (step S501). In this step, the gain control current is adjusted to the current larger than the threshold current.

The wavelength control circuit (DFB) 101a adjusts the DFB portion wavelength control current that is applied to the optical waveguide layer 34 in the DFB portion 2 through the DFB portion wavelength control electrode 45, so as to control one of the plurality of peak wavelengths in the reflection spectrum of the first grating 31a to a desirable lasing wavelength λ0 (step S502). At this time, the relationship between the DFB portion wavelength control current and the peak wavelength in the reflection spectrum of the first grating 31a is previously measured or calculated, and stored in the memory 105 as the initial value.

The wavelength control circuit (DBR) 102 adjusts the DBR portion wavelength control current that is applied to the DBR portion 3 through the DBR portion wavelength control electrode 43, so as to control one of the plurality of peak wavelengths in the reflection spectrum of the second optical waveguide 10b provided with the second grating 32a to a desirable lasing wavelength λ0 (step S503). At this time, the relationship between the DBR portion wavelength control current and the peak wavelength in the reflection spectrum of the second optical waveguide 10b is previously measured or calculated, and stored in the memory 105 as the initial value.

The optical output monitoring device 202 monitors the optical output power of the light that is emitted by the wavelength tunable laser 100 (step S504).

The phase control circuit 103 adjusts the phase control current that is applied through the phase control electrode 42, so as to adjust the lasing wavelength finely and control the optical output power of the light monitored by the optical output monitoring device 202 to be maximum (step S505).

The optical output control circuit 104 adjusts the gain control current that is applied to the active layer 33 in the DFB portion 2 through the gain control electrode 41a, so as to control the optical output power of the light that is emitted by the wavelength tunable laser 100 to a desirable value (step S506).

The wavelength monitoring device 201 monitors the wavelength of the light that is emitted by the wavelength tunable laser 100 (step S507).

The wavelength control circuit (DFB) 101a adjusts again the DFB portion wavelength control current that is applied to the optical waveguide layer 34 in the DFB portion 2 through the DFB portion wavelength control electrode 45, so as to control the wavelength of the light emitted by the wavelength tunable laser 100 to λ0 (step S508).

The wavelength control circuit (DBR) 102 adjusts again the DBR portion wavelength control current that is applied to the DBR portion 3 through the DBR portion wavelength control electrode 43, so as to control the optical output power of the light that is emitted by the wavelength tunable laser 100 to be maximum (step S509).

The phase control circuit 103 adjusts the phase control current that is applied to the phase shift portion 4 through the phase control electrode 42, so as to control the optical output power of the light emitted from the wavelength tunable laser 100 to the maximum output (step S510).

The controller MPU 106 judges whether the optical output power monitored by the optical output monitoring device 202 is a desirable optical output power or higher (step S511).

If the optical output power of the light monitored by the optical output monitoring device 202 is not the desirable optical output or higher (if "No" in step S511), step S506 and subsequent steps are repeated.

If the optical output power of the light monitored by the optical output monitoring device 202 is the desirable optical output power or higher (if "Yes" in step S511), it is judged whether the wavelength accuracy of the wavelength of the light emitted by the wavelength tunable laser 100 and monitored by the wavelength monitoring device 201 is a desirable accuracy or higher (step S512).

If the wavelength accuracy is not the desirable accuracy or higher (if "No" in step S512), step S506 and subsequent steps are repeated.

If the wavelength accuracy is the desirable accuracy or higher (if "Yes" in step S512), the process is ended.

Though not shown for simplification, if the desirable lasing wavelength λ0 is changed, step S502 and subsequent steps are carried out.

Since the second grating 32a in the DBR portion 3 is formed of the PG, the wavelength tunable laser 100 in this embodiment has the reflection spectrum shown in FIG. 4. Thus, as compared with the case in which the second grating 32a in the DBR portion 3 is formed of the SG, the reflectivity in the DBR portion 3 is less wavelength-dependent. As a result, by adjusting the lasing wavelength and the optical output power by the aforementioned process, the threshold gain condition can be constant in a wide wavelength band. Accordingly, the threshold current and the optical output power with each wavelength can be stable.

In addition, since the second grating 32a in the DBR portion 3 is formed of the PG, the peak wavelengths in the reflection spectrum can be limited within a predetermined wavelength band. Thus, the wavelength of the light that is emitted by the wavelength tunable laser can be maintained within the predetermined wavelength band.

Further, since the phase shift portion 4 is provided, the phase of the reflected light can be adjusted. Accordingly, laser light of stable optical output power with a desirable wavelength can be obtained.

Now, the function of the phase shift portion 4 according to this embodiment will be described with reference to FIGS. 7 and 8.

Figure 7:
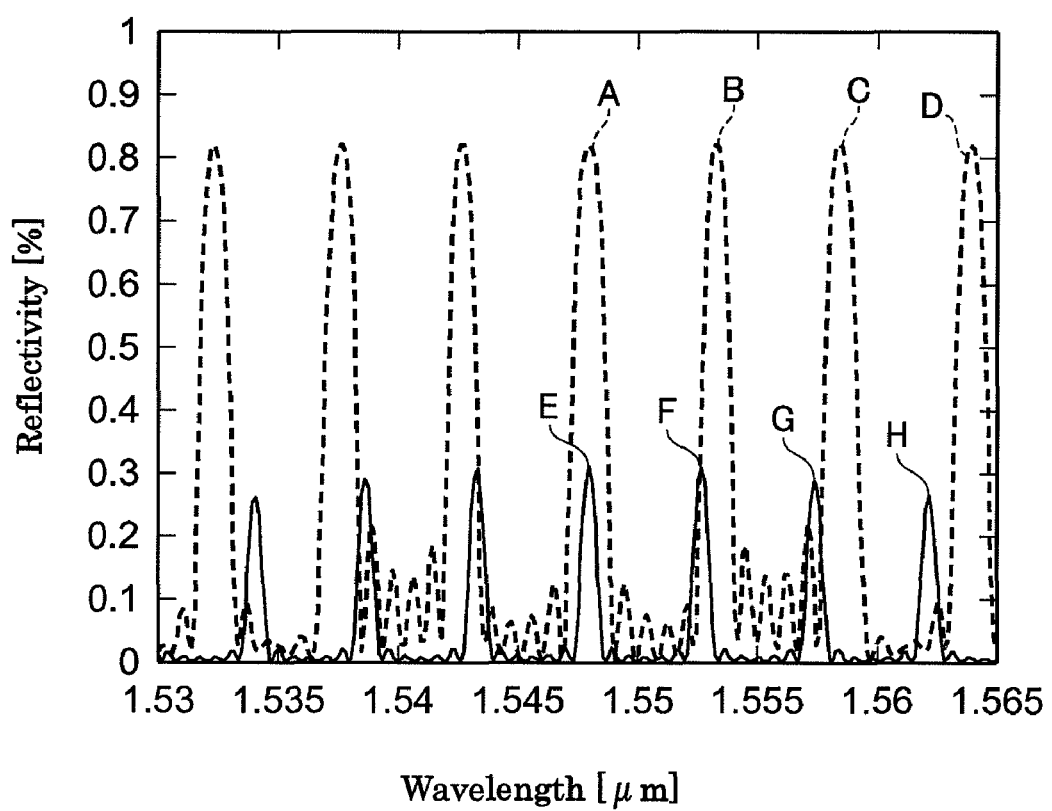
FIG. 7 illustrates reflection spectra for gratings in a DFB portion and a DBR portion of a SG-PG wavelength tunable laser.

A dotted line in FIG. 7 indicates reflectivities in the DBR portion 3 in which the phase grating is formed. A solid line in FIG. 7 indicates reflectivities in the DFB portion 2 in which the first grating 31a of the SG is formed. When the grating in the DBR portion 3 is formed of the PG as indicated by the dotted line in FIG. 7, the reflectivities are less wavelength-dependent as compared with the case in which the grating is formed of the SG.

Herein, the difference between a threshold gain (hereinafter, referred to as Gth0) at each peak wavelength and a corresponding threshold gain (hereinafter, referred to as Gth1) at a wavelength of a longitudinal mode that is closest to the each peak wavelength is called threshold gain difference (Gth1−Gth0). FIG. 8 illustrates a threshold gain difference with each peak wavelength. To estimate the threshold gain difference, the reflection spectrum of the first optical waveguide 10a provided with the first grating 31a formed of the SG is fixed. Furthermore, the DBR portion wavelength control current that is applied to the second optical waveguide 10b provided with the grating formed of the PG is varied, and the reflection peaks of the DBR portion 3 are matched with the reflection peaks of the DFB portion 2 (i.e., the peak wavelengths A, B, C, and D are respectively matched with the peak wavelengths E, F, and H in FIG. 7).

Figure 8:
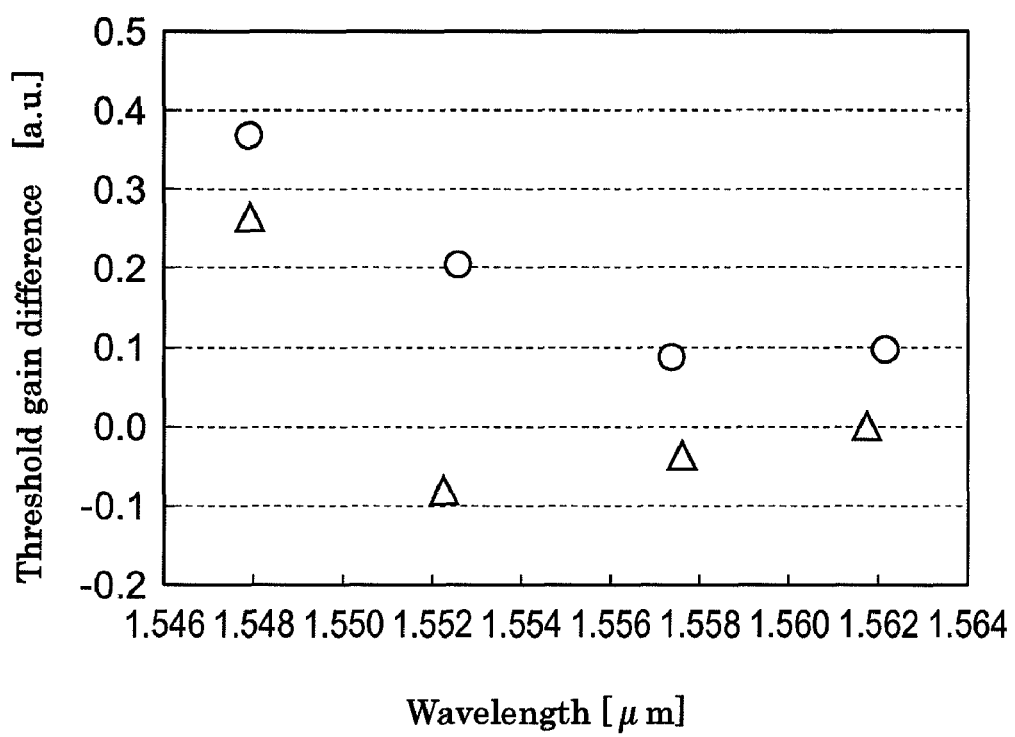
FIG. 8 illustrates threshold gain differences with respective peak wavelengths of the SG-PG wavelength tunable laser.

Referring to FIG. 8, the threshold gain differences without the phase adjustment by the phase shift portion 4 are plotted with white triangles, whereas the threshold gain differences with the phase adjustment by the phase shift portion 4 are plotted with white circles. The phase is adjusted such that the phase control current is applied to the phase shift portion 4 while the reflection peak wavelengths of the DBR portion 3 (PG) are matched with the reflection peak wavelengths of the DFB portion 2 (SG).

It is to be noted that FIG. 8 plots only the case in which the peak wavelengths of the DBR portion 3 (the peak wavelengths A, B, C, and D in FIG. 7) are respectively matched with the peak wavelengths in the DFB portion 2 (the peak wavelengths E, F, G, and H in FIG. 7), in a wavelength range of the center wavelength and larger. The similar tendency appears even when the threshold gain differences in a wavelength range of the center wavelength and smaller are plotted.

If the threshold gain difference is negative, Gth1<Gth0 is established, and the laser may emit light with a wavelength of the closest longitudinal mode to the each peak wavelength.

When the phase is not adjusted as shown in FIG. 8, the threshold gain difference may be negative. Light may be emitted with a wavelength of the closest longitudinal mode to the each peak wavelength. The laser does not emit light with wavelengths with which the peak wavelengths in the reflection spectrum of the first optical waveguide 10*a* in the DFB portion 2 (SG) are matched with the peak wavelength in the reflection spectrum of the second optical waveguide 10*b* in the DBR portion 3 (PG).

In contrast, when the phase is adjusted, the threshold gain difference always becomes positive. Further, by adjusting the phase, a larger threshold gain difference (positive value) can be obtained as compared with the case without the phase adjustment. So, the laser may stably emit light with desirable wavelengths with which the peak wavelengths in the reflection spectrum of the first optical waveguide 10*a* in the DFB portion 2 (SG) are matched with the peak wavelength in the reflection spectrum of the second optical waveguide 10*b* in the DBR portion 3 (PG). Thus, the lasing wavelength can be stable, and a high side mode suppression ratio can be obtained.

Also, the wavelength tunable laser 100 further includes the phase control electrode 42. The phase control current is applied to the phase shift portion 4 through the phase control electrode 42. Thus, by applying the phase control current to the phase shift portion 4, the phase of the light that is guided through the optical waveguide 10 can be adjusted. As a result, light is emitted with a desirable wavelength even if the phase of the light reflected by the DBR portion 3 is largely shifted.

The first grating 31*a* of the wavelength tunable laser 100 may be formed of the SG. With this configuration, since the second grating of the DBR portion 3 is formed of the PG, the reflectivity in the DBR portion 3 is less wavelength-dependent. Also, the peak wavelengths in the reflection spectrum are limited within a predetermined wavelength band. Thus, laser light of stable optical output power with a desirable wavelength can be obtained. Also, since the first grating 31*a* is formed of the SG, the shift of the phase (phase shift amount) at each reflection peak is small. Thus, the phase control can be further facilitated.

The coupling coefficient of the first grating 31*a* is larger than the coupling coefficient of the second grating 32*a*. Thus, the reflectivity in the DBR portion 3 can be further increased.

The wavelength tunable laser 100 includes the DFB portion wavelength control electrode 45. The DFB portion wavelength control current is applied to the first optical waveguide 10*a* through the DFB portion wavelength control electrode 45. By applying the DFB portion wavelength control current to the first optical waveguide 10*a*, the reflection spectrum of the first optical waveguide 10*a* provided with the first grating 31*a* can be further properly adjusted.

In the wavelength tunable laser 100, the third grating 32*b* having the length $\Lambda_{p2}$ is arranged between the plurality of second gratings 32*a* each having the length $\Lambda_{p1}$. That is, the gratings provided in the second optical waveguide 10*b* have different lengths. Thus, by adjusting the different lengths, the number of peak wavelengths in the reflection spectrum can be adjusted.

The length of the second optical waveguide 10*b* in the waveguide direction is larger than the length of the first optical waveguide 10*a* in the waveguide direction. The reflectivity in the DBR portion 3 can be increased.

Second Embodiment

Next, a second embodiment will be described below with reference to FIGS. 9 to 11.

In the first embodiment, the DFB portion wavelength control current is used to vary the reflection spectrum of the first optical waveguide 10*a* in the DFB portion 2. However, the reflection spectrum may be varied by changing the temperature of the wavelength tunable laser. This embodiment will be described next.

Figure 9:
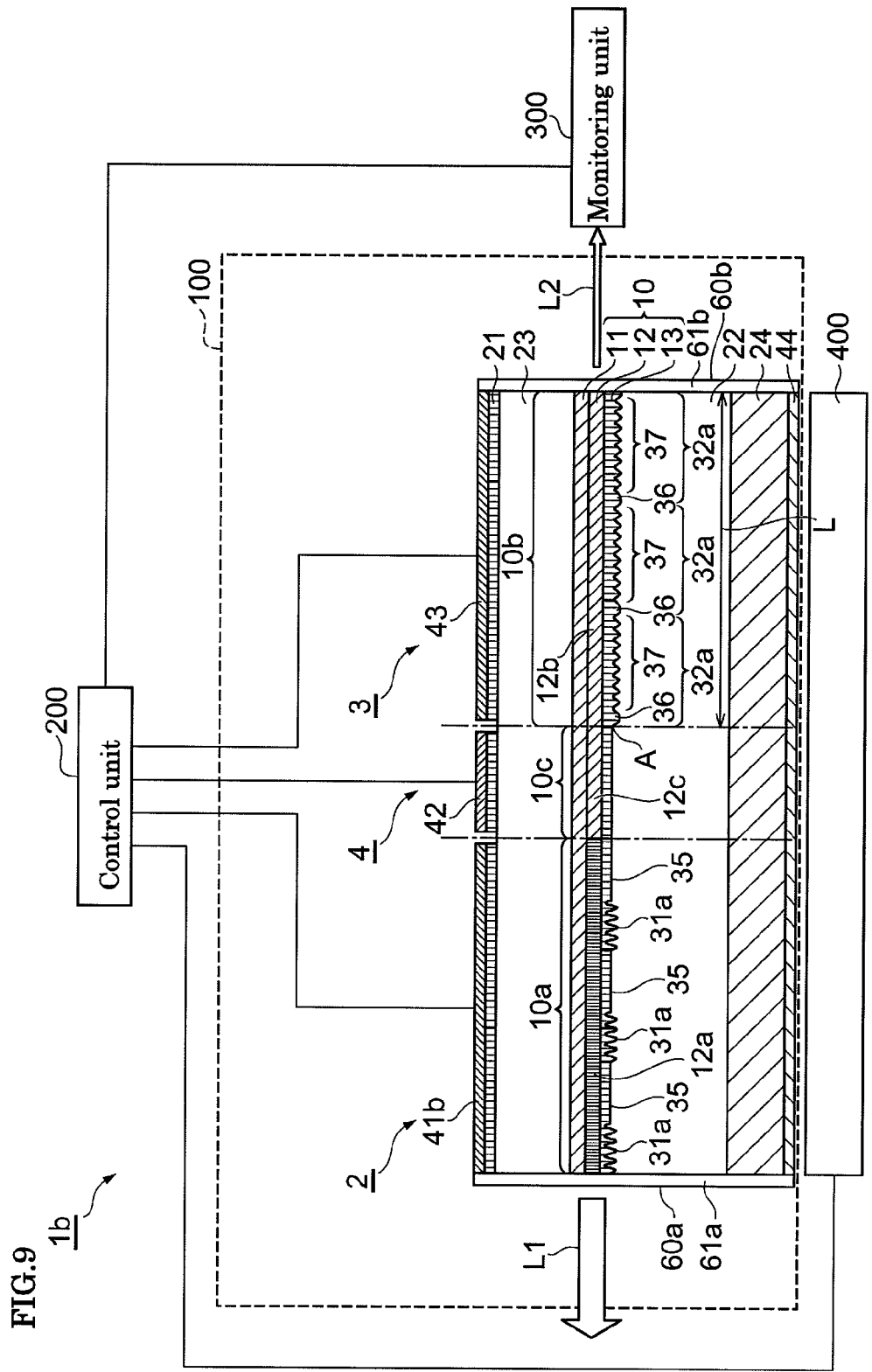
FIG. 9 illustrates a wavelength tunable laser apparatus according to a second embodiment.

Referring to FIG. 9, a wavelength tunable laser apparatus 1*b* according to this embodiment includes a wavelength tunable laser 100, a control unit 200, a monitoring unit 300, and a temperature control unit 400.

A first optical waveguide 10*a* of a DFB portion 2 according to this embodiment includes a first core layer 12*a* formed of a single semiconductor material. A gain control electrode 41*b* is provided on a contact layer 21 in the DFB portion 2. The gain control current that causes a gain to be generated is applied to the first optical waveguide 10*a* through the gain control electrode 41*b*.

The first optical waveguide 10*a* that is provided in the DFB portion 2 and causes a gain to be generated may have, for example, a multi quantum well (MQW) structure made of a group III-V semiconductor of a GaInAsP or an AlGaInAs.

The wavelength tunable laser 100 is provided on the temperature control unit 400. The temperature control unit 400 adjusts the temperature of the first optical waveguide 10*a* in the DFB portion 2. The temperature control unit 400 may be a Peltier device. In addition to the Peltier device, a metal thin-film pattern in a line fashion may be previously formed on the upper surface of the DFB portion 2 of the wavelength tunable laser 100. When current is applied to the metal thin-film, Joule heat is generated. The temperature of the first optical waveguide 10*a* in the DFB portion 2 may be adjusted by using the Joule heat. The temperature control unit 400 is only required to adjust the temperature of at least the first optical waveguide 10*a*. The temperature of the other part in the wavelength tunable laser 100 may be changed simultaneously.

Figure 10:
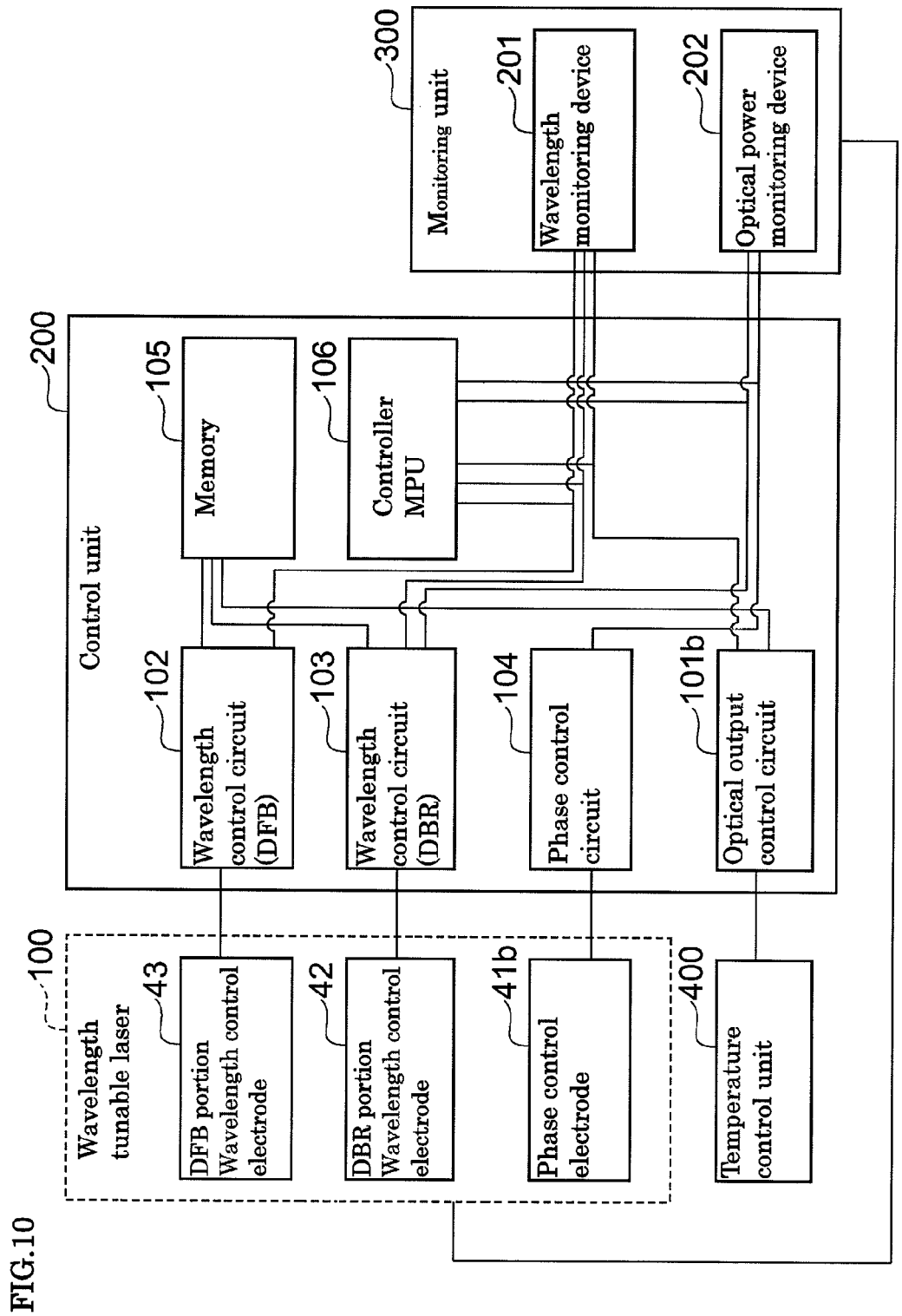
FIG. 10 illustrates a function configuration of a control unit and a monitoring unit shown in FIG. 9.
Figure 11:
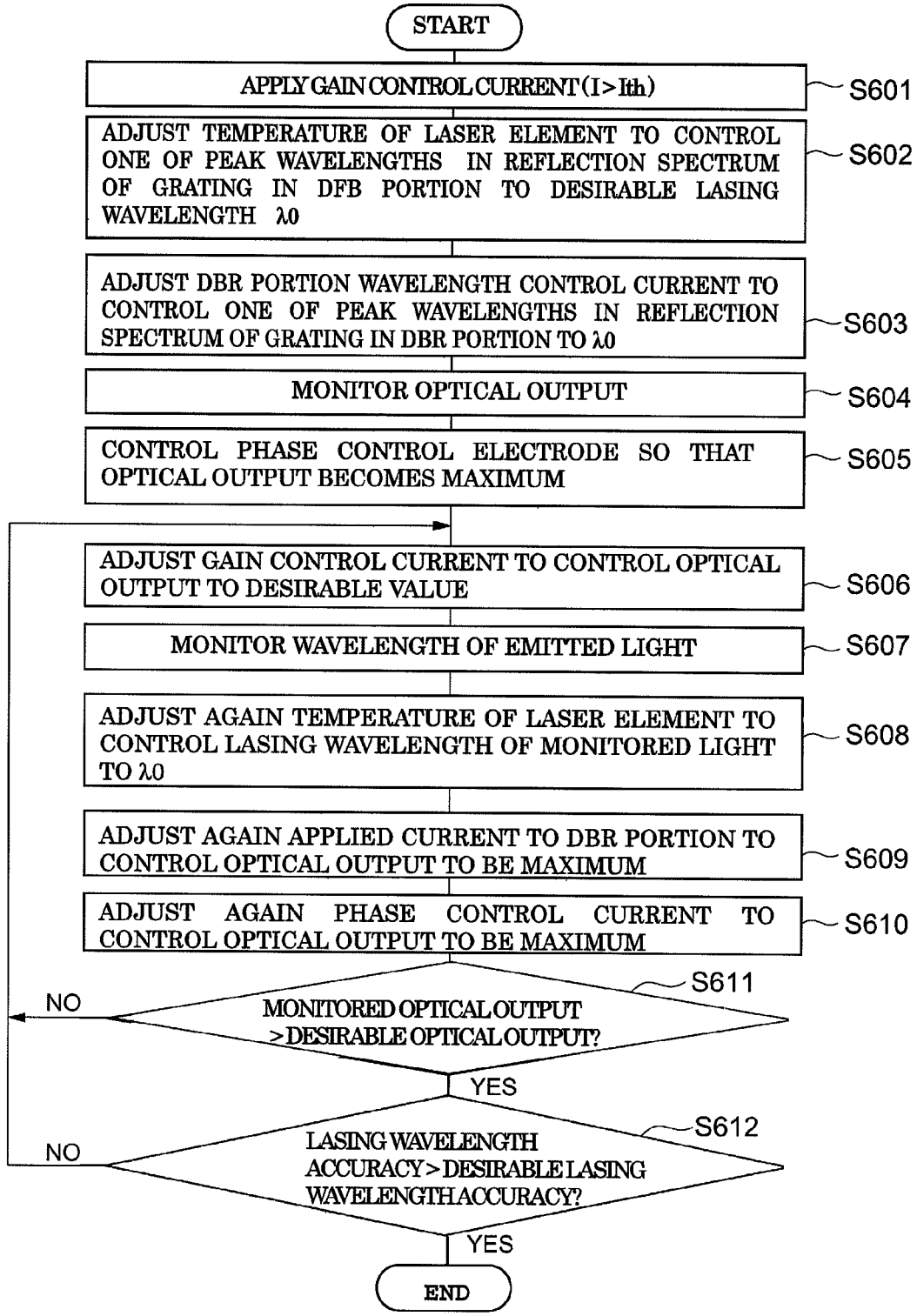
FIG. 11 is a process flowchart showing a wavelength tunable laser control method according to the second embodiment.

FIG. 10 illustrates a function configuration of the control unit 200 and the monitoring unit 300. Referring to FIG. 10, the control unit 200 includes a wavelength control circuit (DFB) 101*b*, a wavelength control circuit (DBR) 102, a phase control circuit 103, an optical output control circuit 104, a memory 105, and a controller MPU 106.

The wavelength control circuit (DFB) 101*b* adjusts the temperature of the first optical waveguide 10*a* in the DFB portion 2 by using the temperature control unit 400. Thus, the wavelength control circuit (DFB) 101*b* has a function of controlling one of the plurality of peak wavelengths in the reflection spectrum of the first optical waveguide 10*a* provided with a first grating 31*a* to a desirable lasing wavelength $\lambda 0$.

In this embodiment, other functions are similar to those described in the first embodiment.

Flow of Process

Next, the flow of process according to this embodiment will be described with reference to FIG. 11.

The optical output control circuit 104 applies the gain control current to the first optical waveguide 10*a* in the DFB portion 2 through the gain control electrode 41*b* (step S601). In this step, the gain control current is adjusted to the current larger than the threshold current.

The wavelength control circuit (DFB) 101*b* controls the temperature of the first optical waveguide 10*a* in the DFB portion 2 by using the temperature control unit 400, so as to control one of the plurality of peak wavelengths in the reflection spectrum of the first optical waveguide 10a provided with the first grating 31a to a desirable lasing wavelength λ0 (step S602). At this time, the relationship between the temperature of the first optical waveguide 10a and the peak wavelength in the reflection spectrum of the first optical waveguide 10a is previously measured or calculated, and stored in the memory 105 as the initial value.

The process in steps S603 to S605 is similar to that in steps S503 to S505 according to the first embodiment, and hence the description thereof will be omitted.

The optical output control circuit 104 adjusts the gain control current that is applied to the first optical waveguide 10a in the DFB portion 2 through the gain control electrode 41b, so as to control the optical output power of the light that is emitted by the wavelength tunable laser 100 to a desirable value (step S606).

The process in step S607 is similar to the process in step S507 according to the first embodiment, and hence the description thereof will be omitted.

The wavelength control circuit (DFB) 101b adjusts again the temperature of the first optical waveguide 10a in the DFB portion 2 by using the temperature control unit 400, so as to control the wavelength of the light emitted by the wavelength tunable laser 100 and monitored by the wavelength monitoring device 201 to the lasing wavelength λ0 (step S608).

The process in step S609 and subsequent steps is similar to that according to the first embodiment.

Modification

Figure 12:
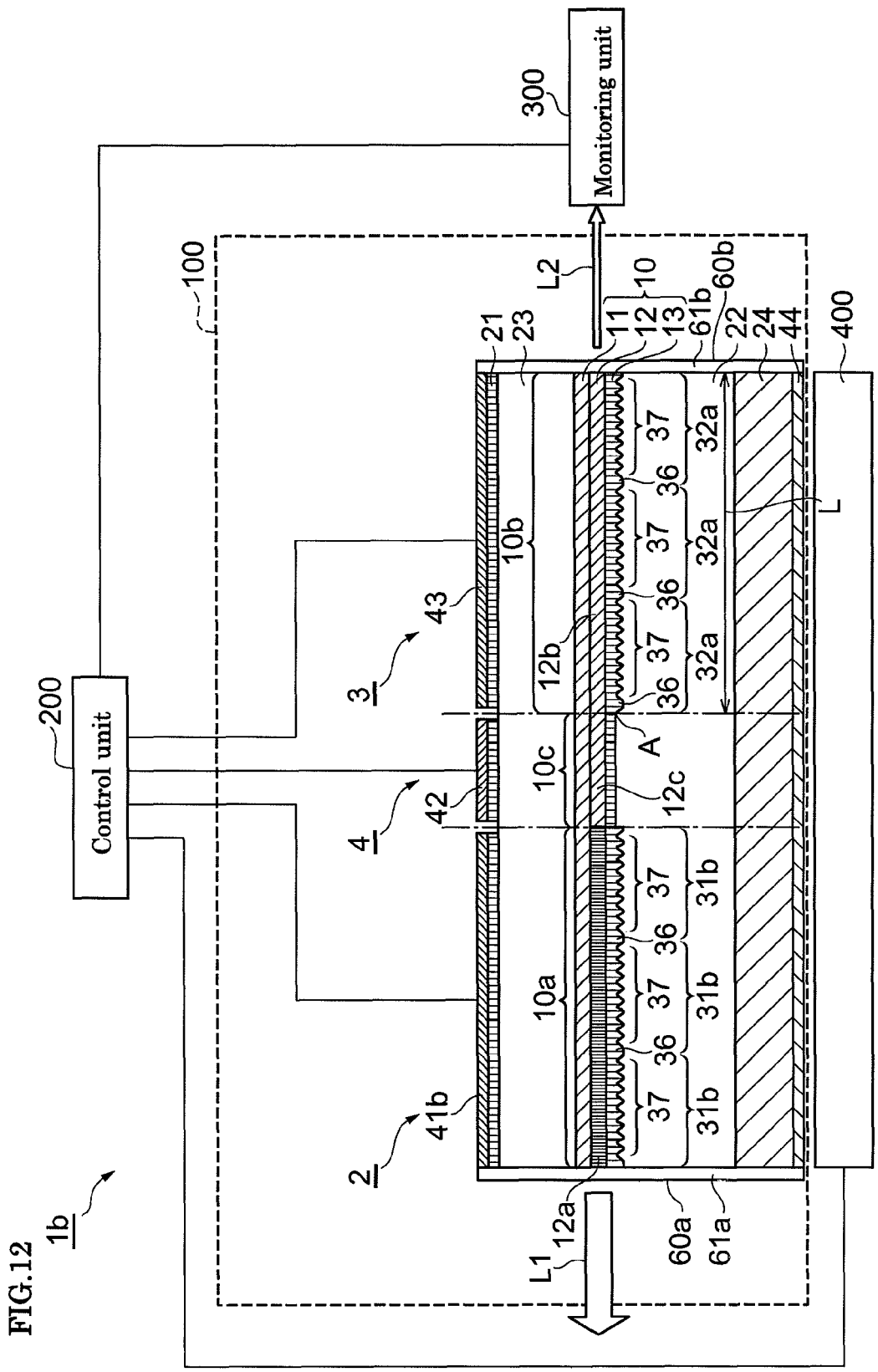
FIG. 12 illustrates a wavelength tunable laser apparatus according to a modification of the second embodiment.
Figure 13:
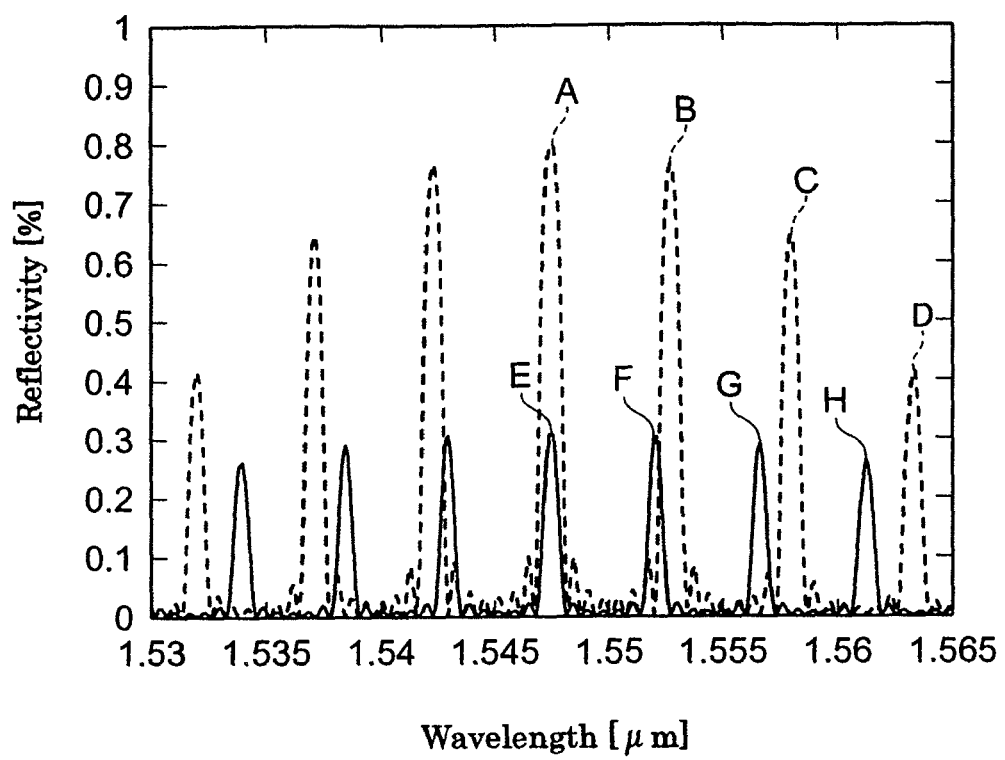
FIG. 13 is an explanatory view of related art.
Figure 14:
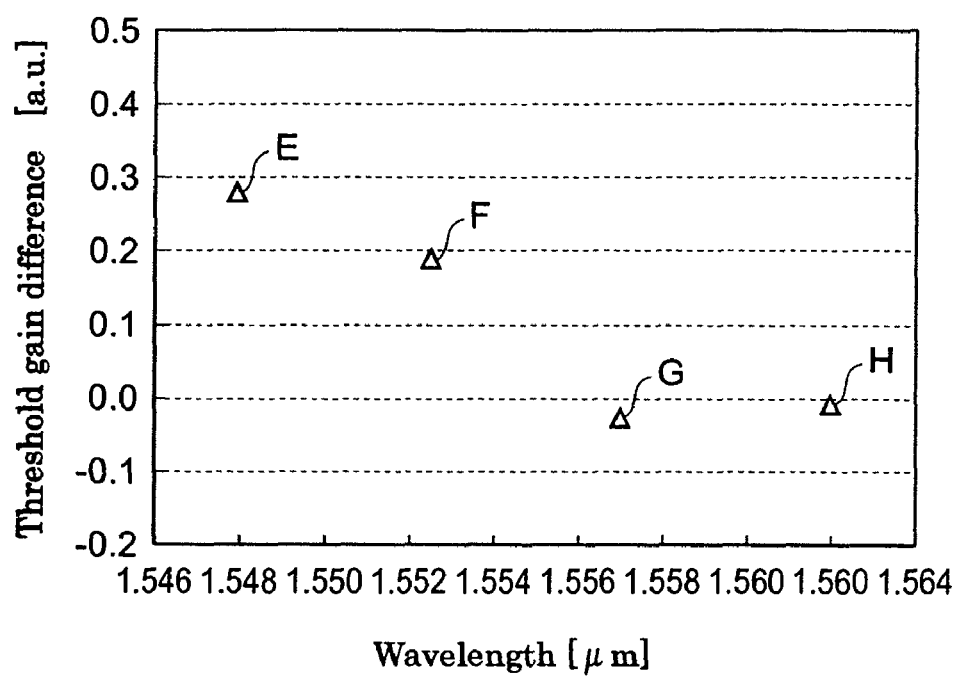
FIG. 14 is an explanatory view of the related art.

Next, a modification of this embodiment will be described with reference to FIG. 12. FIG. 12 is different from FIG. 9 in that the grating provided in the first optical waveguide 10a in the DFB portion 2 is formed of the SG in FIG. 9, whereas the grating in FIG. 12 is formed of the PG.

In this modification, a wavelength tunable laser 100 includes a first optical waveguide 10a provided with a first grating 31a formed of a PG, and a second optical waveguide 10b provided with a grating formed of a PG. The wavelength tunable laser 100 emits light with a desirable wavelength by using the vernier effect between the peak wavelength in the reflection spectrum of the first optical waveguide 10a and the peak wavelength in the reflection spectrum of the second optical waveguide 10b. To use the vernier effect, the PG in the DFB portion 2 is different from the PG in the DBR portion 3. That is, the wavelength interval of the peak wavelengths in the reflection spectrum of the first optical waveguide 10a is different from the wavelength interval of the peak wavelengths in the reflection spectrum of the second optical waveguide 10b.

With the configuration of this modification, the coupling coefficient of the first grating 31b in the DFB portion 2 can be decreased as compared with the case in which the grating in the DFB portion 2 is formed of a SG. Thus, the formation of the grating can be facilitated.

The first optical waveguide 10a of the wavelength tunable laser 100 according to this embodiment includes a plurality of first gratings 31b provided in the waveguide direction. The first gratings 31b each include a grating formation area 37 and a grating phase shift area 36. The grating formation area 37 has the periodic recesses and projections to form an optical grating. In the grating formation area 37, the refractive index varies with a predetermined period. The grating phase shift area 36 shifts the phase of the light that is guided through the optical waveguide 10 by shifting the phase of the grating. That is, the first grating 31b in the DFB portion 2 is formed of the PG. Thus, the coupling coefficient of the gratings can be decreased as compared with the case in which the first grating in the DFB portion 2 is formed of a SG. Thus, the formation of the grating can be facilitated.

The wavelength tunable laser 100 according to this embodiment tunes the wavelength of the light that is emitted by the wavelength tunable laser 100 by adjusting the temperature of the first optical waveguide 10a. Accordingly, the wavelength of the light that is emitted by the wavelength tunable laser 100 can be further easily tuned.

While the principle of the present invention has been described above with reference to the preferable embodiments, it will be apparent to those skilled in the art that the arrangement and details of the present invention can be modified without departing from the principle. The present invention is not limited to the specific configurations disclosed in the embodiments. Therefore, the following claims and the scope thereof are to be accorded the broadest interpretation so as to encompass all modifications and changes.

What is claimed is:

1. A wavelength tunable laser, comprising:
   a DFB portion including a first optical waveguide provided with a first grating;
   a DBR portion including a second optical waveguide that is optically coupled to the first optical waveguide and is provided with a plurality of second gratings and a plurality of third gratings arranged between the second gratings in the second optical waveguide; and
   a phase shift portion including a third optical waveguide that is optically coupled to the first and second optical waveguides, the third optical waveguide being adjacent to the second optical waveguide at an interface therebetween,
   wherein each of the second gratings has a grating formation area in which a grating is formed, and a grating shift area, the grating phase shift area shifting the phase of the grating adjacent thereto in the second grating,
   the second gratings are periodically arranged from a start position in a waveguide direction, the start position being at a distance from the interface,
   each of the grating formation areas in the second gratings substantially has a same length,
   the second grating has a first length in the waveguide direction, and
   the length of the grating shift area is a half or quarter of a period of the grating of the second grating, and
   wherein each of the third gratings has a grating formation area in which a grating is formed, and a grating phase shift area, the grating phase shift area shifting the phase of the grating adjacent thereto in the third grating, and
   wherein the third grating has a second length in the waveguide direction, the second length being different from the first length.

2. The wavelength tunable laser according to claim 1, further comprising: a phase control electrode provided on the phase shift portion.

3. The wavelength tunable laser according to claim 1, wherein each of the grating phase shift areas in a plurality of second gratings substantially has a same length.

4. The wavelength tunable laser according to claim 1, wherein the second grating includes a periodic recesses and projections to form the grating.

5. The wavelength tunable laser according to claim 1, wherein the first grating is formed of a sampled grating.

6. The wavelength tunable laser according to claim 5, wherein the first grating has a larger coupling coefficient than a coupling coefficient of the second grating.

7. The wavelength tunable laser according to claim 1, wherein the first optical waveguide has a plurality of the first gratings continuously arranged in the waveguide direction, and wherein each of the first gratings has a grating formation area in which a grating is formed, and a grating phase shift area, the grating phase shift area shifting the phase of the grating adjacent thereto in the first grating.

8. The wavelength tunable laser according to claim 1, further comprising: a temperature control unit to adjust a temperature of the first optical waveguide.

9. The wavelength tunable laser according to claim 8, the temperature control unit is a Peltier device.

10. The wavelength tunable laser according to claim 8, the temperature control unit is made of a metal thin-film formed on the upper surface of the DFB portion.

11. The wavelength tunable laser according to claim 1, further comprising: a DFB portion wavelength control electrode provided on the DFB portion.

12. The wavelength tunable laser according to claim 1, wherein the grating formed in grating formation area of the second grating and the grating formed in grating formation area of the third grating substantially have a same period.

13. The wavelength tunable laser according to claim 1, wherein the grating phase shift area of the second grating and the grating phase shift area of the third grating substantially have a same length.

14. The wavelength tunable laser according to claim 1, wherein the second optical waveguide has a larger length in the waveguide direction than a length of the first optical waveguide in the waveguide direction.

15. A wavelength tunable laser, comprising:
a DFB portion including a first optical waveguide provided with a first grating;
a DBR portion including a second optical waveguide that is optically coupled to the first optical waveguide and is provided with a plurality of second gratings;
a phase shift portion including a third optical waveguide that is optically coupled to the first and second optical waveguides, the third optical waveguide being adjacent to the second optical waveguide at an interface therebetween,
a plurality of third gratings arranged between the second gratings in the second optical waveguide, wherein the third grating has a grating formation area in which a grating is formed, and a grating phase shift area, the grating phase shift area shifting the phase of the grating adjacent thereto in the third grating, and wherein the third grating has a second length in the waveguide direction, the second length being different from the first length,
wherein each of the second grating has a grating formation area in which a grating is formed, and a grating shift area, the grating phase shift area shifting the phase of the grating adjacent thereto in the second grating,
the second gratings are periodically arranged from a start position in a waveguide direction, the start position being at a distance from the interface,
each of the grating formation areas in the second gratings substantially has a same length,
the second grating has a first length in the waveguide direction,
the grating formed in grating formation area of the second grating and the grating formed in grating formation area of the third grating substantially have a same period, and
the grating phase shift area of the second grating and the grating phase shift area of the third grating substantially have a same length.

* * * * *